(12) United States Patent
Tews

(10) Patent No.: US 6,534,376 B2
(45) Date of Patent: Mar. 18, 2003

(54) PROCESS FLOW FOR SACRIFICIAL COLLAR SCHEME WITH VERTICAL NITRIDE MASK

(75) Inventor: Helmut Horst Tews, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/930,690

(22) Filed: Aug. 15, 2001

(65) Prior Publication Data

US 2003/0036241 A1 Feb. 20, 2003

(51) Int. Cl.[7] .............................................. H01L 21/20
(52) U.S. Cl. ........................ 438/386; 438/243; 438/244; 438/387
(58) Field of Search ................................. 438/239, 243, 438/244, 253, 386, 387, 388, 397

(56) References Cited

U.S. PATENT DOCUMENTS 6,261,972 B1    7/2001   Tews et al.
6,309,924 B1 *  10/2001  Divakaruni et al. ......... 438/243
6,376,324 B1 *  4/2002   Mandelman et al. ....... 438/386
6,429,092 B1 *  8/2002   Beintner et al. ............. 438/425

* cited by examiner

Primary Examiner—Matthew Smith
Assistant Examiner—Craig P. Lytle
(74) Attorney, Agent, or Firm—Slater & Matsil, L.L.P.

(57) ABSTRACT

A process flow for forming a sacrificial collar (132) within a deep trench (113) of a semiconductor memory cell. A nitride liner layer (120) is deposited over a substrate (111). A thin polysilicon layer (122) is deposited over the nitride liner layer (120), and an oxide layer (124) is formed. A resist (116) is deposited within the trenches (113) and etched back. The top portion of the oxide layer (124) is removed, and the resist (116) is removed from the trenches (113). The wafer (100) is exposed to a nitridation process to form a nitride layer (128) over exposed portions of the polysilicon layer (122). The oxide layer (124) and polysilicon layer (124) are removed from the bottom of the trenches. (113). The nitride liner layer (120) is removed from the bottom of the trenches (113). The polysilicon layer (122) is removed from the top of the trenches (113) to leave a sacrificial collar (132) in the top of the trenches 113 formed by nitride liner layer (120).

27 Claims, 2 Drawing Sheets

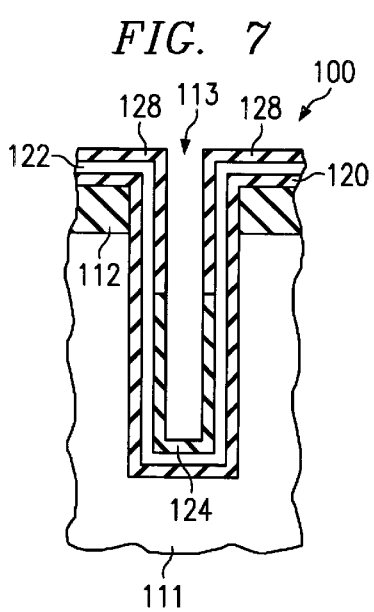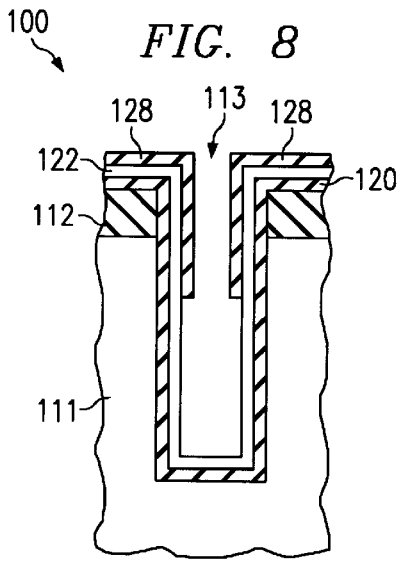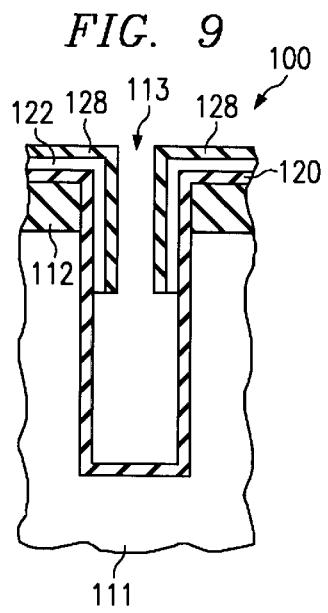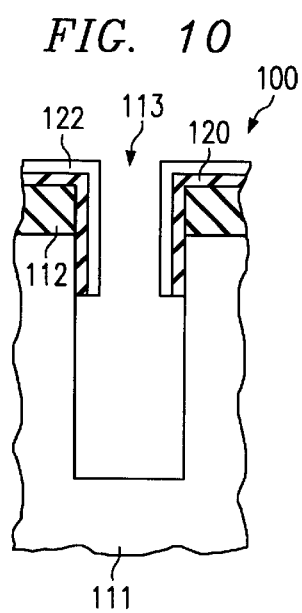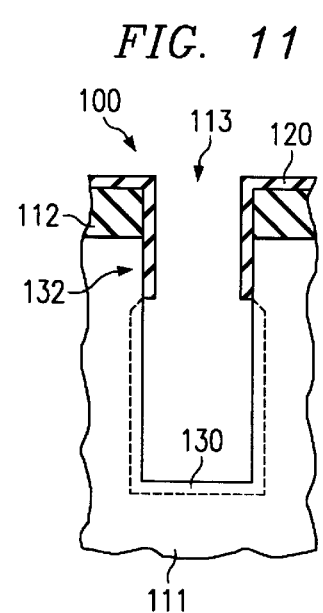

PROCESS FLOW FOR SACRIFICIAL COLLAR SCHEME WITH VERTICAL NITRIDE MASK

TECHNICAL FIELD

The present invention relates generally to the fabrication of integrated circuits (IC's), and more particularly to the fabrication of memory IC's.

BACKGROUND

Semiconductor devices are used in a variety of electronic applications, such as personal computers and cellular phones, for example. One such semiconductor product widely used in electronic systems for storing data is a semiconductor memory, and one common type of semiconductor memory is a dynamic random access memory (DRAM).

A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

DRAM storage capacitors are typically formed by etching deep trenches in a semiconductor substrate, and depositing a plurality of layers of conductive and insulating materials in order to produce a storage capacitor that is adapted to store data, represented by a one or zero. Prior art DRAM designs typically comprise an access FET disposed in a subsequently deposited layer, disposed above and to the side of the storage capacitor.

The semiconductor industry in general is being driven to decrease the size of semiconductor devices located on integrated circuits. Miniaturization is generally needed to accommodate the increasing density of circuits necessary for today's semiconductor products. More recent DRAM designs involve disposing the access FET directly above the storage capacitor, sometimes referred to as a vertical DRAM, which saves space and results in the ability to place more DRAM cells on a single chip.

An element known as a sacrificial collar is a sacrificial component that is temporarily disposed on the upper portion of storage cell deep trenches during the manufacturing of a DRAM. A sacrificial collar is used to protect the trench sidewall in the top area of the trench. This area houses the vertical FET and the buried strap region that couples the storage cell to the access FET in the finished DRAM device. The area extends from the surface to the highly doped area called buried plate.

While a sacrificial collar is in place, various process steps are performed on the bottom part of a deep trench, such as the widening of the deep trench below the sacrificial collar, which is often referred to as bottle etch, and various doping of the substrate within the deep trench. A sacrificial collar is typically replaced by more permanent insulating collars later in the manufacturing process.

SUMMARY OF THE INVENTION

Embodiments of the present invention achieve technical advantages as a sacrificial collar with a vertical thermal nitride mask having a greater thickness than prior art sacrificial collars with a vertical thermal nitride mask. The nitride liner layer that forms the sacrificial collar is deposited in a deposition step such as a chemical-vapor deposition (CVD) process, so that the thickness of the sacrificial collar deposited is well-controlled and may be achieved to the desired thickness.

In one embodiment, disclosed is a method of processing a semiconductor device that includes a deep trench formed within a substrate, the method comprising depositing a nitride liner layer over the deep trench, depositing a semiconductor layer over the nitride liner layer, and forming a first oxide layer over a lower portion of the semiconductor layer so that an upper portion of the semiconductor layer is exposed. The method includes forming a nitride layer over the exposed upper portion of the semiconductor layer, removing the first oxide layer, leaving the lower portion of the semiconductor layer exposed, removing the exposed semiconductor layer, leaving a lower portion of the nitride liner layer exposed, and removing the exposed nitride liner layer lower portion and the nitride layer from the upper portion.

Also disclosed is a method of manufacturing a semiconductor memory cell, comprising providing a semiconductor substrate, forming a trench in the substrate, and depositing a nitride liner layer over the substrate. A semiconductor layer is deposited over the nitride liner layer, a first oxide layer is formed over the semiconductor layer. In a next step, the trench is filled with resist. The resist is removed from the top portion of the trench, to leave a bottom portion of the resist within the trench, leaving a portion of the first oxide layer exposed. The exposed first oxide layer portion is removed, to leave a portion of the semiconductor layer exposed. The resist in the trench bottom portion is removed to leave a portion of the first oxide layer exposed. A nitride layer is formed over the exposed semiconductor layer portion, and the exposed first oxide layer portion is removed, leaving a lower portion of the semiconductor layer exposed. The exposed semiconductor layer lower portion is removed, leaving a lower portion of the nitride liner layer exposed. The exposed nitride liner layer lower portion and the nitride layer in the upper portion of the trench are removed.

Further disclosed is a method of processing a semiconductor device having a substrate, the method comprising forming a first layer comprised of a first material over the substrate, forming a second layer comprised of a second material over the first layer, forming a third layer comprised of a third material over a portion of the second layer so that a portion of the second layer is exposed, and forming a fourth layer comprised of the first material over the exposed portion of the second layer. The method includes removing the third layer, leaving a portion of the second layer exposed, removing the exposed second layer, leaving a portion of the first layer exposed, and removing the exposed first layer lower portion and the fourth layer.

Advantages of embodiments of the invention include the ability to control the thickness of a sacrificial collar to a greater degree than in the prior art. A wide range of sacrificial collar thicknesses may be achieved with embodiments of the present invention. A semiconductor wafer utilizing the increased thickness sacrificial collar in accordance with embodiments of the present invention may be subject to further processing, such as a plurality of cleaning steps and gas phase doping steps, without damage to or removal of the sacrificial collar. Fewer subsequent bottle etch steps may be required because portions of the substrate within trenches may be removed during the removal of semiconductor layer residing over the sacrificial collar.

BRIEF DESCRIPTION OF THE DRAWINGS

The above features of embodiments of the present invention will be more clearly understood from consideration of the following descriptions in connection with accompanying drawings in which:

FIGS. 5–11 illustrate cross-sectional views of a manufacturing process flow for the formation of a sacrificial collar in accordance with embodiments of the present invention.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of a prior art process for forming a deep trench sacrificial collar will be described, followed by a description of some preferred embodiments of the present invention and some advantages thereof. A cross-section of one memory cell is shown in each figure, although many other memory cells and components of memory cells may be present in the semiconductor devices shown.

Figure 1:
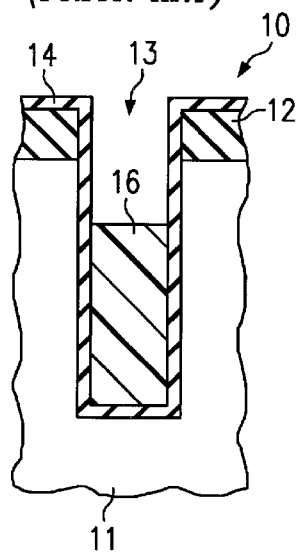
FIGS. 1–4 illustrate cross-sectional views of a manufacturing process for forming a sacrificial collar within a deep trench of a DRAM cell in accordance with a prior art process.

FIGS. 1–4 show cross-sectional views of a semiconductor wafer 10 comprising a DRAM storage cell in various stages of manufacturing in accordance with a prior art method. In FIG. 1, a substrate 11 is provided, the substrate 11 comprising a semiconductor material, e.g., silicon. A pad nitride 12 is deposited over the substrate 11. Deep trenches 13 are formed within the pad nitride 12 and substrate 11, as shown, using conventional lithography techniques, for example. The deep trenches 13 typically have a high aspect ratio, e.g., the trench depth is significantly greater than the width. When viewed from the top of the wafer 10, trenches 13 are typically oval in shape, although trenches 13 may comprise other shapes, for example. Trenches 13 may be several $\mu$m deep and several hundred nm to less than 100 nm wide, for example.

In an oxidation step, the wafer 10 is exposed to oxygen to form an oxide layer 14 which may comprise about 50 Å of silicon dioxide, for example. A resist 16 is deposited over the wafer 10, and the resist 16 is etched back to a depth of approximately 1 $\mu$m, for example, below the top surface of the substrate 11, as shown in FIG. 1.

Figure 2:
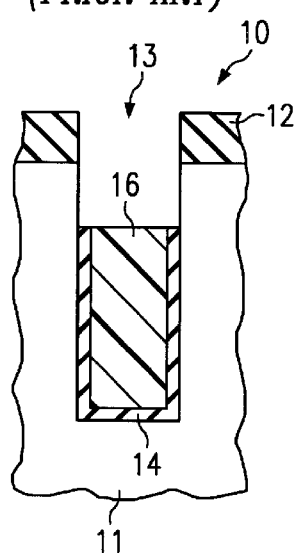

The oxide layer 14 is etched to remove the oxide layer 14 from the top portion of the trench 13, as shown in FIG. 2. The resist 16 in the bottom of the trench 13 protects the oxide layer 14 within the trench lower portion during the etch step, and the oxide layer 14 remains within the bottom part of the trench 13.

Figure 3:
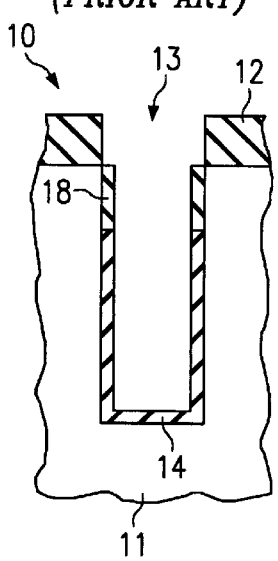

The resist 16 is removed from the trench 13, as shown in FIG. 3. The wafer 10 is exposed to a nitridation process to form a thin thermal nitride layer 18 over the exposed substrate 11 at the top part of the trench 13. In the nitridation process, the wafer 10 is exposed to ammonia ($NH_3$) at a high temperature to form thin nitride layer 18. The exposed silicon substrate 11 forms a nitride layer 18 more quickly than the oxide layer 14. The nitridation process can be stopped before the oxide layer 14 begins forming a nitride layer 18 over the top thereof, so that only the exposed portions of the substrate 11 at the top of the trenches 13 are nitridized.

Figure 4:
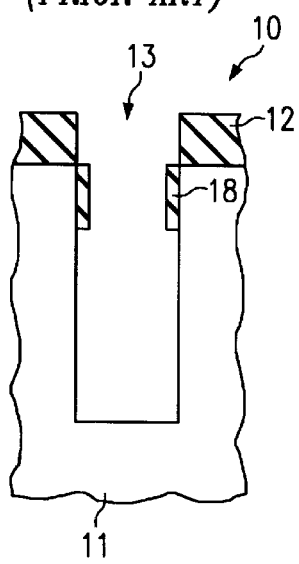

The oxide layer 14 is removed selectively from within the trench 13 bottom to leave the structure shown in FIG. 4, having a nitride layer 18 disposed over the sidewalls of the trench 13 at the top of the trench 13. The nitride layer 18 may function as a sacrificial collar during processing of the trench.

A problem with the prior art DRAM manufacturing process shown in FIGS. 1–4 is that nitride layer 18 is extremely thin, comprising only about 15 Å of silicon nitride, for example. Such a thin nitride layer 18 has an insufficient thickness to withstand the multiple cleaning and etching processes that the wafer 10 must be subjected to in the manufacturing process. The thin sacrificial collar 18 may be etched away during these cleaning and etching processes and cease functioning as a protective layer for the upper portion of the trench 13. Furthermore, the thin sacrificial collar 18 is of an insufficient thickness to allow a large process window for a bottle etch, a process during which the lower trench 13 diameter is enlarged in order to increase the capacitance of the deep trench 13 storage cell. The thin sacrificial collar 18 also lacks sufficient thickness to withstand gas-phase doping of the lower part of the trenches 13 in subsequent trench 13 processing steps. During gas-phase doping, the sacrificial collar needs to provide a masking layer that is a sufficient barrier to dopant penetration.

Embodiments of the present invention achieve technical advantages as a semiconductor device manufacturing process flow for forming a sacrificial collar having a greater thickness than prior art sacrificial collars, thus being adapted to withstand multiple cleaning and etching processes in the manufacturing flow without removal of or damage to the sacrificial collar. Gas phase doping of the substrate within a trench may also be achieved by the use of embodiments of the present invention. A process flow for forming a sacrificial collar in accordance with the present invention will next be described.

Figure 5:
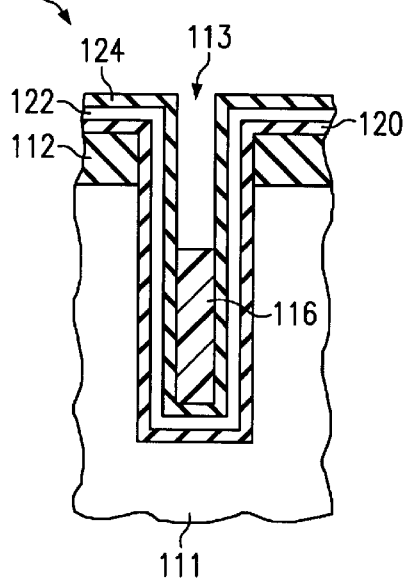

A substrate 111 is provided, as shown in FIG. 5. The substrate 111 typically comprises a semiconductor material such as single-crystal silicon, and may include other conductive layers or other semiconductor elements such as transistors or diodes, as examples. The substrate 111 may alternatively comprise compound semiconductors such as GaAs, InP, Si/Ge, SiC, as examples.

A pad nitride 112 is deposited over the substrate 111. The pad nitride 112 may comprise silicon nitride deposited in a thickness of 100–300 nm, for example, and alternatively, pad nitride 112 may comprise other nitrides. The wafer 100 is patterned using conventional lithography techniques and etched to form deep trenches 113 in substrate 11 and pad nitride 112, as shown in FIG. 5. Deep trenches 113 may be 10 $\mu$m deep and 100 nm in diameter wide, as examples, although these parameters are a function of the ground rules for the particular device being manufactured.

A nitride liner layer 120 is deposited or formed over the wafer 100 to cover the pad nitride 112 and the substrate 111 within the deep trenches 113. Nitride liner layer 120 preferably comprises silicon nitride or $Si_3N_4$ deposited in a thickness of 50–150 Å. Nitride liner layer 120 may alternatively comprise other nitrides, as examples.

A thin semiconductor layer 122 is deposited or formed over the nitride liner layer 120. Semiconductor layer 122 preferably comprises 50–200 Å of polysilicon, for example. Alternatively, other semiconductor materials such as Ge or SiGe may be used for the material of the semiconductor layer 122, as examples.

A first oxide layer 124 is formed over semiconductor layer 122. First oxide layer 124 preferably comprises an oxide such as silicon dioxide formed in a range of 20–100 Å. Alternatively, first oxide layer 124 may comprise other oxides, as examples. Preferably, oxide layer 124 is formed in a thermal oxidation process, although oxide layer 124 may alternatively be deposited, as examples.

A resist 116 is deposited over the wafer 100 and is etched such that the resist 116 is recessed below the top of the substrate 111 by about 1 μm, for example, as shown in FIG. 5. The removal of the upper portion of resist 116 is preferably performed by a chemical dry etch (CDE), with the CDE adapted to stop on the first oxide layer 124. Alternatively, the upper portion of resist 116 may be removed using other etch techniques and chemistries.

Figure 6:
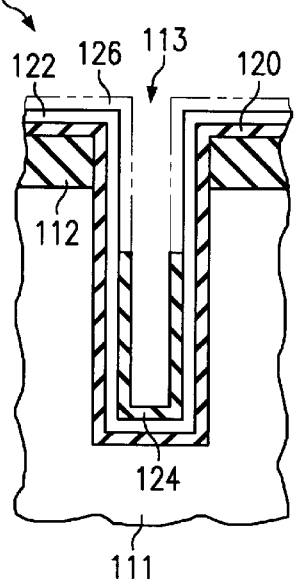

Exposed portions of first oxide layer 124 not covered by resist 116 are removed, for example, in an etch process, as shown in FIG. 6, leaving a portion of the first oxide layer 124 remaining within the bottom of the trenches 113. The first oxide layer 124 etch process may be selective to the semiconductor layer 122 material, and may comprise a wet chemical etch, as examples.

The resist 116 remaining within the trenches 113 is removed, e.g., stripped, using a CDE selective to semiconductor layer material 122 and first oxide layer 124, for example.

An optional second oxide layer 126 (shown in phantom in FIG. 6) may be deposited or formed over the exposed portions of semiconductor layer 122 prior to the removal of the resist 116. The optional second oxide layer 126 can ease the resist removal from the trench bottom. Second oxide layer 126 is preferably thinner than first oxide layer 124. For example, second oxide layer 126 may be about 5 A to 20 A thick. Second oxide layer 126 may comprise a thin plasma oxide, or may alternatively comprise other oxides such as an ozone oxide, as examples. Second oxide layer 126 is preferably removed after the resist 116 is removed from the trenches 113. Second oxide layer 126 may be removed in a cleaning step, for example.

The wafer 100 is exposed to a nitridation process, as shown in FIG. 7, to form a thermal nitride layer 128 over exposed portions of the semiconductor layer 122. Preferably the nitridation process comprises exposing the wafer 100 to a nitrogen-containing chemical, such as $NH_3$. Because there is a time delay between nitridation of the semiconductor layer 122 and the nitridation of the first oxide layer 124, the nitride layer 128 comprises a very thin layer of nitride, e.g. about 15 Å of silicon nitride. The nitride layer 128 is grown on over the semiconductor layer 122 only, and in particular, nitride is not grown over first oxide layer 124, in accordance with an embodiment of the invention.

The wafer 100 is exposed to an oxide etch process to remove first oxide layer 124 from the bottom of the trenches 113, as shown in FIG. 8. Preferably, the first oxide layer 124 etch comprises an oxide etch selective to nitride so that the nitride layer 128 remains unaffected by the oxide etch process.

The wafer 100 is then exposed to an etch process to remove the semiconductor layer 122 from the bottom of the trenches 113, as shown in FIG. 9. For example, if the semiconductor layer 122 comprises polysilicon, a polysilicon etch is performed.

The wafer 100 is next exposed to a nitride etch process that is preferably selective to the semiconductor layer material 122, as shown in FIG. 10. The nitride etch process removes the thin nitride layer 128 from the top of the wafer and the sides of the upper portion of the trenches 113. In addition, advantageously, this nitride etch process removes the nitride liner layer 120 in the lower portion of the trench 113.

The wafer 100 is exposed to a semiconductor material etch, to remove the semiconductor layer 122 that acted as a mask for nitride liner layer 120 in previous manufacturing steps, shown in FIG. 11. Advantageously, this semiconductor material etch may also function as a bottle etch or a partial bottle etch, because portions 130 of the substrate 111 within the lower part of the trenches 113 may also be removed during the etch process. Removing portions 130 of the substrate 111 within trenches 113 is advantageous because fewer subsequent bottle etch steps may be required, in accordance with an embodiment of the invention.

The structure remaining, shown in FIG. 11, comprises a sacrificial collar 132 disposed within the upper interior regions of the trenches 113, formed by the nitride liner layer 120 remaining in the upper portion of trenches 113. The sacrificial collar 132 protects the upper region of the trenches 113. Additional bottle etch steps and doping processes may be performed on the lower part of the trench 113 prior to the removal of the anti-collar 132 in preparation for subsequent processing steps. In addition to bottle etch steps, buried plate doping may be performed on the bottom of the trenches 113, for example.

While embodiments of the present invention are primarily described herein with reference to DRAM devices, they also have useful application in ferroelectric random access memory (FRAM) devices and other semiconductor devices, as examples.

The materials described as preferable for the various layers 120, 122, 124, 128, may alternatively comprise other materials. For example, nitride liner layer 120 and nitride layer 128 may alternatively comprise oxides or semiconductor materials, as examples. Semiconductor layer 122 may alternatively comprise oxides or nitrides, as examples. First oxide layer 124 may alternatively comprise nitrides or semiconductor materials, as examples. Preferably, the nitride layer 128 and nitride liner layer 120 comprise the same material so that layer 128 and layer 120 may be etched with the same chemistries and etch steps.

Embodiments of the present invention provide several advantages over prior art sacrificial collar techniques. Advantages include the ability to control the thickness of the sacrificial collar 132 to a greater degree than in the prior art. A wide range of sacrificial collar 132 thicknesses may be achieved with embodiments of the present invention. Virtually any thickness of nitride liner layer 120 may be deposited in accordance with embodiments of the present invention. Thus, the sacrificial collar 132 comprises a sufficient thickness to protect the top collar of the trenches 113 during a bottle etch. The sacrificial collar is also of sufficient thickness to withstand gas-phase doping steps used for doping the lower part of the trenches 113.

Furthermore, cleaning the semiconductor wafer 100 with a plurality of cleaning steps is not a concern, with the greater thickness sacrificial collar 132 in accordance with embodiments of the present invention. Fewer subsequent bottle etch steps may be required because portions 130 of the substrate 111 within trenches 113 may be removed during the removal of semiconductor layer 122 residing over the sacrificial collar 132.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of processing a semiconductor device that includes at least one deep trench having an upper portion formed within a substrate, the method comprising:
    depositing a nitride liner layer over the deep trench;
    depositing a semiconductor layer over the nitride liner layer;
    forming a first oxide layer over a lower portion of the semiconductor layer so that an upper portion of the semiconductor layer is exposed;
    forming a nitride layer over the exposed upper portion of the semiconductor layer;
    removing the first oxide layer, leaving the lower portion of the semiconductor layer exposed;
    removing the exposed semiconductor layer, leaving a lower portion of the nitride liner layer exposed; and
    removing the exposed nitride liner layer lower portion and the nitride layer in the trench upper portion.

2. The method according to claim 1, further comprising:
    removing the semiconductor layer, leaving a top portion of the nitride liner layer within the trench.

3. The method according to claim 2, wherein a portion of the substrate is removed while removing the semiconductor layer.

4. The method according to claim 1, wherein forming the first oxide layer comprises:
    forming a first oxide material over the semiconductor layer;
    depositing resist over the first oxide layer;
    removing a top portion of the resist to leave a bottom portion of the resist within the trench, leaving a portion of the first oxide material exposed;
    removing the exposed first oxide material portion to leave a first oxide layer in the bottom of the trench.

5. The method according to claim 4, further comprising:
    forming a second oxide layer over the exposed portions of the semiconductor layer; and
    removing the second oxide layer after removing the resist.

6. The method according to claim 1, wherein the semiconductor layer comprises polysilicon, the nitride liner layer comprises $Si_3N_4$, and the first oxide layer comprises $SiO_2$.

7. The method according to claim 6, wherein depositing the nitride liner layer comprises depositing 50–150 Å of SiN.

8. The method according to claim 1, wherein removing the first oxide layer comprises an etch process selective to the nitride liner layer.

9. The method according to claim 1, wherein removing the exposed nitride liner layer lower portion and the nitride layer comprises an etch process selective to the semiconductor layer.

10. The method according to claim 1, further comprising widening the bottom portion of the trench, wherein the nitride liner layer top portion masks the trench top portion.

11. The method according to claim 1, wherein the semiconductor device comprises a dynamic random access memory (DRAM).

12. A method of manufacturing a semiconductor device, comprising:
    providing a semiconductor substrate;
    forming a trench in the substrate;
    depositing a nitride liner layer over the substrate;
    depositing a semiconductor layer over the nitride liner layer;
    forming a first oxide layer over the semiconductor layer;
    depositing a resist layer over the first oxide layer;
    removing a top portion of the resist layer to leave a bottom portion of the resist layer within the trench, leaving a portion of the first oxide layer exposed;
    removing the exposed first oxide layer portion to leave a portion of the semiconductor layer exposed;
    removing the resist layer trench bottom portion to leave a portion of the first oxide layer exposed;
    forming a nitride layer over the exposed semiconductor layer portion;
    removing the exposed first oxide layer portion, leaving a lower portion of the semiconductor layer exposed;
    removing the exposed semiconductor layer lower portion, leaving a lower portion of the nitride liner layer exposed; and
    removing the exposed nitride liner layer lower portion and the nitride layer.

13. The method according to claim 12, further comprising removing the semiconductor layer, leaving a top portion of the nitride liner layer within the trench.

14. The method according to claim 13, wherein a portion of the substrate is removed while removing the semiconductor layer.

15. The method according to claim 12, further comprising:
    depositing a second oxide layer over exposed portions of the semiconductor layer, after removing the exposed first oxide layer portion; and
    removing the second oxide layer after removing the resist layer trench portion.

16. The method according to claim 12, wherein the semiconductor layer comprises polysilicon, the nitride liner layer comprises $Si_3N_4$, and the first oxide layer comprises $SiO_2$.

17. The method according to claim 12, wherein depositing the nitride liner layer comprises depositing 50–150 Å of SiN.

18. The method according to claim 12, wherein removing the resist layer top portion comprises a chemical dry etch process adapted to stop on the first oxide layer.

19. The method according to claim 12, wherein removing the first oxide layer comprises an etch process selective to the semiconductor layer, wherein removing the resist layer trench bottom portion comprises an etch process selective to the semiconductor layer and the first oxide layer, and wherein removing the exposed first oxide layer portion comprises an etch process selective to the nitride liner layer.

20. The method according to claim 12, wherein removing the exposed nitride liner layer lower portion and the nitride layer comprises an etch process selective to the semiconductor layer and the substrate.

21. The method according to claim 12, further comprising etching the substrate within the trench, wherein the nitride liner layer top portion masks the trench top portion.

22. The method according to claim 12, wherein the semiconductor device comprises a memory cell.

23. The method according to claim 12, wherein the nitride layer is formed after the resist layer is removed.

24. A method of processing a semiconductor device having a substrate, the method comprising:

forming a first layer comprised of a first material over the substrate;

forming a second layer comprised of a second material over the first layer;

forming a third layer comprised of a third material over a portion of the second layer so that a portion of the second layer is exposed;

forming a fourth layer comprised of the first material over the exposed portion of the second layer;

removing the third layer, leaving a portion of the second layer exposed;

removing the exposed second layer, leaving a portion of the first layer exposed; and removing the exposed first layer portion and the fourth layer.

25. The method according to claim 24, wherein the semiconductor device includes a plurality of deep trenches formed within the substrate.

26. The method according to claim 25, further comprising removing the second layer, leaving a top portion of the first layer within the trench.

27. The method according to claim 26, wherein the semiconductor device substrate is comprised of the second material, wherein a portion of the substrate is removed while removing the second layer.

* * * * *